United States Patent
Cheng et al.

(10) Patent No.: US 12,069,826 B2
(45) Date of Patent: Aug. 20, 2024

(54) FLEXIBLE DISPLAY PANEL AND ELECTRONIC DEVICE

(71) Applicant: Wuhan China Star Optoelectronics Semiconductor Display Technology Co., Ltd., Hubei (CN)

(72) Inventors: Yapeng Cheng, Hubei (CN); Zikang Feng, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/621,240

(22) PCT Filed: Nov. 30, 2021

(86) PCT No.: PCT/CN2021/134317
§ 371 (c)(1),
(2) Date: Dec. 21, 2021

(87) PCT Pub. No.: WO2023/087389
PCT Pub. Date: May 25, 2023

(65) Prior Publication Data
US 2024/0032227 A1    Jan. 25, 2024

(30) Foreign Application Priority Data
Nov. 22, 2021  (CN) .......................... 202111389158.9

(51) Int. Cl.
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
CPC .................................................. H05K 5/0226
See application file for complete search history.

(56) References Cited

U.S. PATENT DOCUMENTS

2019/0132987 A1* 5/2019 Koo ........................ H05K 7/18
2020/0272200 A1  8/2020 Hou et al.

FOREIGN PATENT DOCUMENTS

| CN | 111064833 | 4/2020 |
|----|-----------|--------|
| CN | 111316344 | 6/2020 |
| CN | 112927625 | 6/2021 |
| CN | 113053238 | 6/2021 |
| CN | 113129752 | 7/2021 |
| CN | 113202857 | 8/2021 |
| CN | 113241011 | 8/2021 |
| CN | 113299195 | 8/2021 |
| CN | 214476073 | 10/2021 |
| CN | 113593416 | 11/2021 |

* cited by examiner

*Primary Examiner* — Mukundbhai G Patel (57) ABSTRACT

A flexible display panel and an electronic device are provided. The flexible display panel includes a flexible display panel body and a support layer disposed on a side of the flexible display panel body. The support layer includes a first bendable portion and a second bendable portion that are adjacent to each other. The first bendable portion includes a first bendable sub-portion and a second bendable sub-portion that are both provided with openings. The second bendable portion includes a third bendable sub-portion and a fourth bendable sub-portion that are both provided with openings.

19 Claims, 5 Drawing Sheets

FLEXIBLE DISPLAY PANEL AND ELECTRONIC DEVICE

RELATED APPLICATIONS

This application is a National Phase of PCT Patent Application No. PCT/CN2021/134317 having International filing date of Nov. 30, 2021, which claims the benefit of priority of Chinese Patent Application No. 202111389158.9 filed on Nov. 22, 2021. The contents of the above applications are all incorporated by reference as if fully set forth herein in their entirety.

FIELD AND BACKGROUND OF THE INVENTION

The present disclosure relates to the technical field of display, and particularly to a flexible display panel and an electronic device.

Currently, foldable display devices have become a major development direction of display industry. In order to solve a problem that a surface size of a foldable display device does not match a size of a flexible screen before and after the foldable display device is folded, a support plate avoidance mechanism is usually disposed in a bending mechanism of an inwardly foldable display device. By avoiding a support plate, enough space is reserved for a folded flexible display panel body, and the flexible display panel body forms "a drop shape" in a bending area. In an outwardly foldable display device, it is necessary to make a surface of a bending mechanism contacting a flexible display panel body always match the flexible display panel body, so that the flexible-screen display panel body is neither pulled nor crushed.

However, in current designs, when a foldable electronic device is folded inwardly or outwardly, its flexible display panel body has different bending radii. Therefore, when the foldable electronic device is folded inwardly or outwardly, a part of the flexible display panel body that participates in bending has different areas. A bending radius of the flexible display panel body when folded inwardly is usually less than a bending radius of the flexible display panel body when folded outwardly. Accordingly, when the flexible display panel body is folded outwardly, its flexible portion may be arched, which may cause the flexible display panel body to be crushed and damaged when the flexible display panel body is folded inwardly.

SUMMARY OF THE INVENTION

The present disclosure provides a flexible display panel and an electronic device to solve shortcomings of current flexible display panels and electronic devices.

In order to solve the above technical problem, the present disclosure provides a flexible display panel, comprising:
  a flexible display panel body; and
  a support layer disposed on a side of the flexible display panel body and comprising a first bendable portion and a second bendable portion that are adjacent to each other, wherein the first bendable portion comprises a first bendable sub-portion and a second bendable sub-portion that are sequentially away from the second bendable portion, the second bendable portion comprises a third bendable sub-portion and a fourth bendable sub-portion that are sequentially away from the first bendable portion, and the first bendable sub-portion, the second bendable sub-portion, the third bendable sub-portion, and the fourth bendable sub-portion are all provided with openings;
  wherein when the flexible display panel body is in a first folded state, the flexible display panel body comprises a first flexible portion that is folded, and a second portion and a third portion located on opposite sides of the first flexible portion, the first bendable sub-portion and the third bendable sub-portion are disposed opposite to each other and respectively support opposite sides of the first flexible portion, and the second bendable sub-portion and the fourth bendable sub-portion are disposed opposite to each other and respectively support the second portion and the third portion;
  when the flexible display panel body is in a second folded state, the flexible display panel body comprises a second flexible portion that is folded, the first bendable sub-portion and the second bendable sub-portion support a side of the second flexible portion, and the third bendable sub-portion and the fourth bendable sub-portion support an opposite side of the second flexible portion; and
  a bending direction of the second flexible portion is opposite to a bending direction of the first flexible portion, and the first flexible portion is located within a boundary of the second flexible portion.

The present disclosure further provides an electronic device comprising the aforementioned flexible display panel.

The present disclosure has the following beneficial effects. The present disclosure provides a flexible display panel and an electronic device. The flexible display panel comprises a flexible display panel body and a support layer disposed on a side of the flexible display panel body. The support layer comprises a first bendable portion and a second bendable portion that are adjacent to each other. The first bendable portion comprises a first bendable sub-portion and a second bendable sub-portion that are sequentially away from the second bendable portion. The second bendable portion comprises a third bendable sub-portion and a fourth bendable sub-portion that are sequentially away from the first bendable portion. The first bendable sub-portion, the second bendable sub-portion, the third bendable sub-portion, and the fourth bendable sub-portion are all provided with openings. When the flexible display panel body is in any folded state, the first bendable sub-portion, the second bendable sub-portion, the third bendable sub-portion, and the fourth bendable sub-portion provided with the openings can support one corresponding flexible portion of the flexible display panel body, so that users will not feel any step difference of the flexible display panel when touching. Furthermore, the support layer can prevent the flexible display panel body from being significantly arched after the flexible display panel body is folded outwardly, thereby preventing the flexible display panel body from being crushed and damaged when the flexible display panel body is folded inwardly.

BRIEF DESCRIPTION OF THE SEVERAL VIEWS OF THE DRAWINGS

Specific implementation of the present disclosure will be described in detail below in conjunction with accompanying drawings to make technical solutions and beneficial effects of the present disclosure obvious.

DESCRIPTION OF SPECIFIC EMBODIMENTS OF THE INVENTION

The present disclosure provides a flexible display panel and an electronic device. In order to make purposes, technical solutions, and effects of the present invention clearer and more definite, the present invention will be further described in detail below with reference to accompanying drawings and embodiments. It should be understood that specific embodiments described herein are only used to explain the present invention, not used to limit the present invention.

The present disclosure will be further described in detail below in combination with the accompanying drawings and the specific embodiments.

Figure 1:
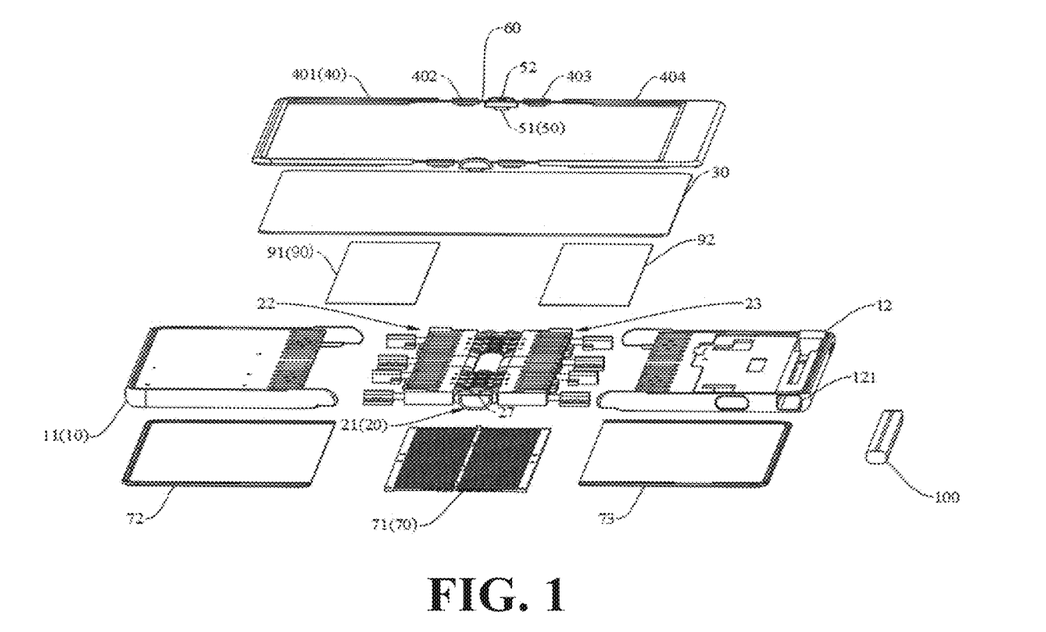
FIG. 1 is an exploded view of a flexible display panel according to an embodiment of the present disclosure at a first viewing angle.
Figure 2:
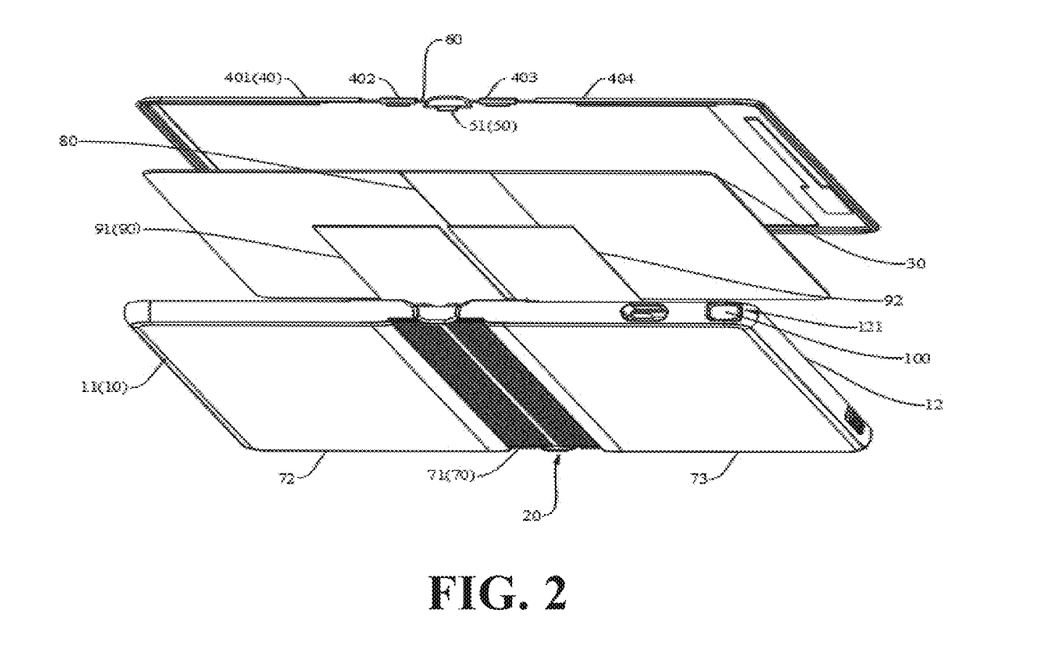
FIG. 2 is an exploded view of the flexible display panel according to an embodiment of the present disclosure at a second viewing angle.
Figure 3:
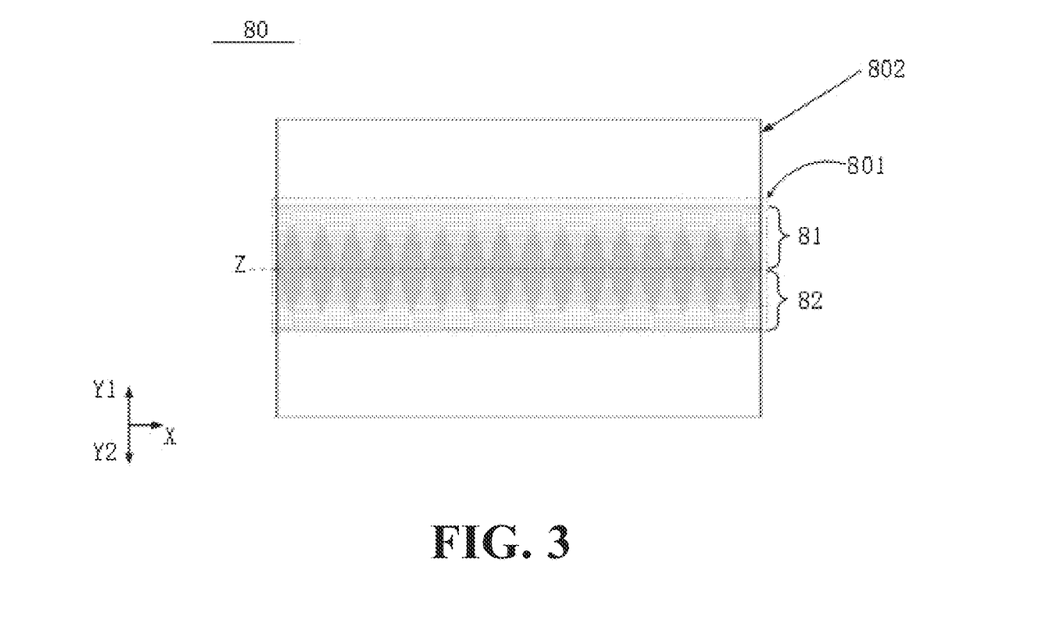
FIG. 3 is a schematic structural diagram of a support layer of the flexible display panel according to an embodiment of the present disclosure.
Figure 4:
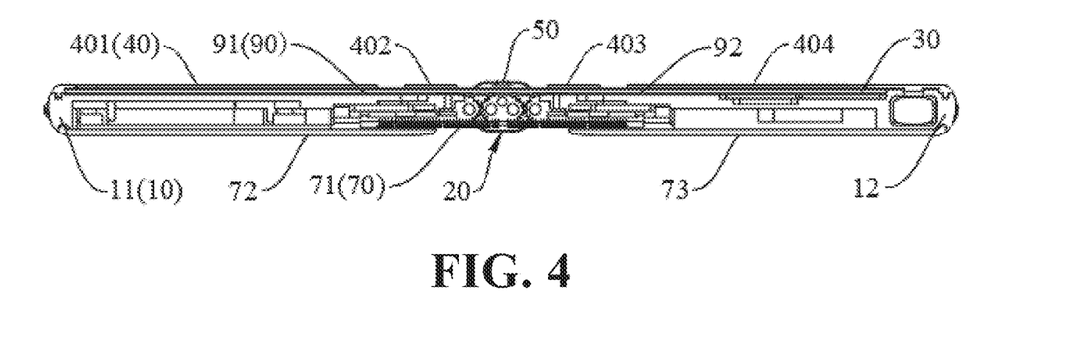
FIG. 4 is a schematic cross-sectional view of the flexible display panel according to an embodiment of the present disclosure in an unfolded state.

Please refer to FIG. 1 to FIG. 4. FIG. 1 is an exploded view of a flexible display panel according to an embodiment of the present disclosure at a first viewing angle. FIG. 2 is an exploded view of the flexible display panel according to an embodiment of the present disclosure at a second viewing angle. FIG. 3 is a schematic structural diagram of a support layer of the flexible display panel according to an embodiment of the present disclosure. FIG. 4 is a schematic cross-sectional view of the flexible display panel according to an embodiment of the present disclosure in an unfolded state.

The present disclosure provides a flexible display panel. The flexible display panel comprises a flexible display panel body 30, a front frame structure 40, a support layer 80, a housing 10, and a hinge 20.

In this embodiment, the housing 10 comprises a first housing 11 and a second housing 12. The hinge 20 is housed in the housing 10 and connected to the first housing 11 and the second housing 12. The first housing 11 and the second housing 12 may be a first middle frame and a second middle frame of the flexible display panel, respectively. The first middle frame and the second middle frame may be configured to carry the flexible display panel body 30. The hinge 20 comprises a bending portion 21, a first support portion 22 disposed on a side of the bending portion 21 and corresponding to the first housing 11, and a second support portion 23 disposed on an opposite side of the bending portion 21 and corresponding to the second housing 12. A side of the first support portion 22 is rotatably connected to the side of the bending portion 21, and an opposite side of the first support portion 22 is slidably connected to the first housing 11. A side of the second support portion 23 is rotatably connected to the opposite side of the bending portion 21, and an opposite side of the second support portion 23 is slidably connected to the second housing 12.

The flexible display panel body 30 is disposed in the housing 10 and is disposed on sides of the first housing 11, the second housing 12, and the hinge 20. The support layer 80 is disposed between the flexible display panel body 30 and the hinge 20.

It can be understood that when the flexible display panel is in an unfolded state, a front side of the first support portion 22 and a front side of the second support portion 23 form an angle of about 180°, so that the flexible display panel body 30 is unfolded and is parallel to the first support portion 22 and the second support portion 23. It should be noted that in this embodiment, the unfolded state may mean that the flexible display panel body 30 is fully unfolded.

In this embodiment, the flexible display panel body 30 comprises, but is not limited to, a substrate (not shown), a display function layer (not shown), a touch function layer (not shown), and an ultra-thin glass (UTG, not shown), and a flexible cover plate (not shown) that are stacked in sequence. In order to ensure that the ultra-thin glass can be folded, a thickness of a part of the ultra-thin glass corresponding to a bending area is generally less than 70 μm. The flexible cover plate is made of a transparent polymer material and has good optical properties and anti-wear properties, so as to protect a screen. Preferably, the flexible cover plate may be a cover glass (CG) or a 3D cover plate, which is not specifically limited in this embodiment. Specifically, the flexible display panel body 30 further comprises, but is not limited to, a copper layer, a pressure-sensitive adhesive layer, a white latex layer, a foam rubber layer, and a heat dissipation layer disposed on a side of the substrate away from the display function layer. The support layer 80 may be any layer disposed on the side of the substrate away from the display function layer, or may be a separate layer disposed between the flexible display panel body 30 and the hinge 20, which is not specifically limited in this embodiment.

It should be noted that in this embodiment, the support layer 80 is disposed on a side of the heat dissipation layer away from the substrate, which is taken as an example to illustrate a technical solution of the present disclosure. The support layer 80 is made of stainless steel (SUS), but is not limited thereto.

In this embodiment, the support layer 80 comprises a first bendable portion 81 and a second bendable portion 82 that are adjacent to each other. Specifically, the support layer 80 comprises at least one first bending area 801 and non-bending areas 802 located on opposite sides of the first bending area 801. The first bending area 801 comprises the first bendable portion 81 and the second bendable portion 82 that can be symmetrically bent along a bending centerline.

It is understandable that "the support layer 80 comprises the at least one first bending area 801 and the non-bending areas 802 located on the opposite sides of the first bending area 801" is only an example. In another embodiment, an entirety of the support layer 80 may be configured as a bendable structure.

Figure 5:
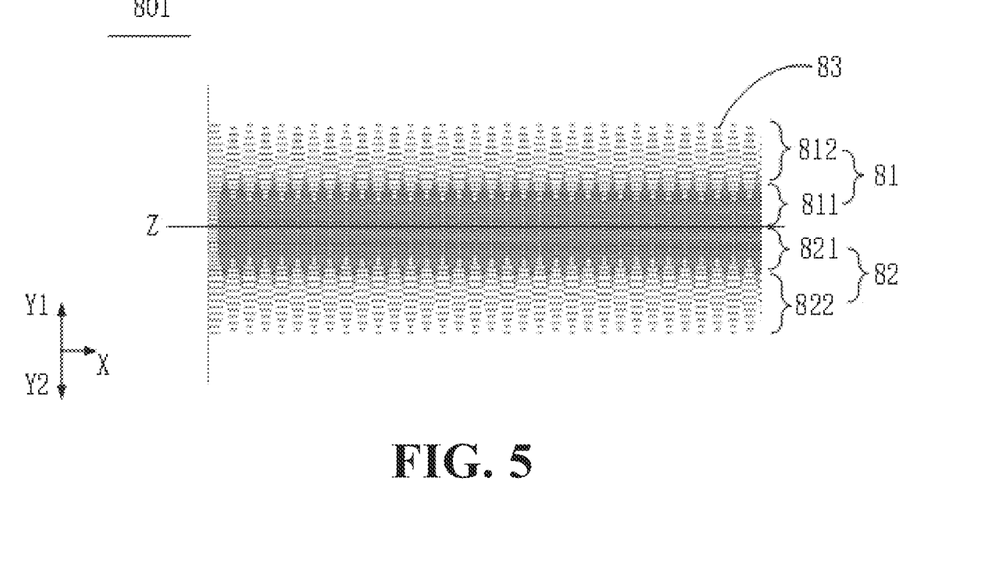
FIG. 5 is a schematic cross-sectional view of a first bending area of the support layer of the flexible display panel according to an embodiment of the present disclosure.

Furthermore, please refer to FIG. 5. FIG. 5 is a schematic cross-sectional view of a first bending area of the support layer of the flexible display panel according to an embodiment of the present disclosure.

In this embodiment, the first bendable portion 81 comprises a first bendable sub-portion 811 and a second bendable sub-portion 812 that are sequentially away from the second bendable portion 82. The second bendable portion 82 comprises a third bendable sub-portion 821 and a fourth bendable sub-portion 822 that are sequentially away from the first bendable portion 81. The first bendable sub-portion 811, the second bendable sub-portion 812, the third bendable sub-portion 821, and the fourth bendable sub-portion 822 are all provided with openings 83.

A shape of the openings 83 may be, but is not limited to, an elongated shape, a diamond shape, an oval shape, a circular shape, or the like, which is not limited in this embodiment. It should be noted that in this embodiment, the shape of the openings 83 is an elongated shape, and contour shapes of its opposite ends are semicircular arc shapes, which is taken as an example to illustrate the technical solution of the present disclosure.

Figure 6A:
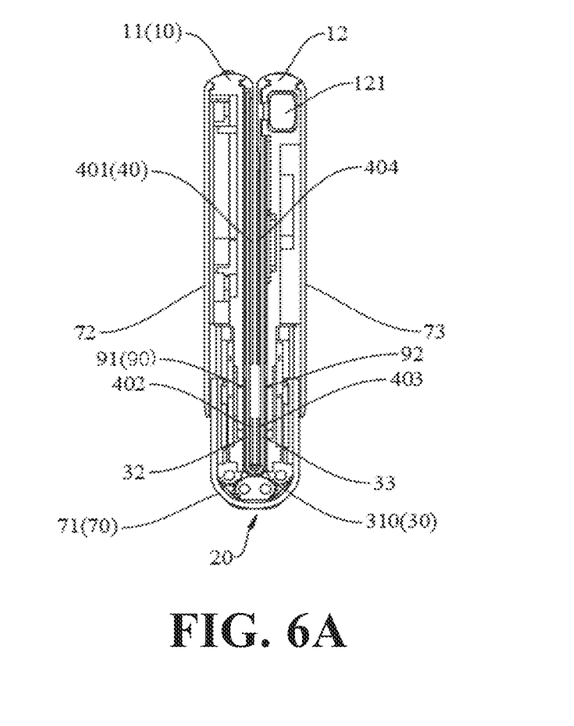
FIG. 6A is a schematic cross-sectional view of the flexible display panel according to an embodiment of the present disclosure in a first folded state.
Figure 6B:
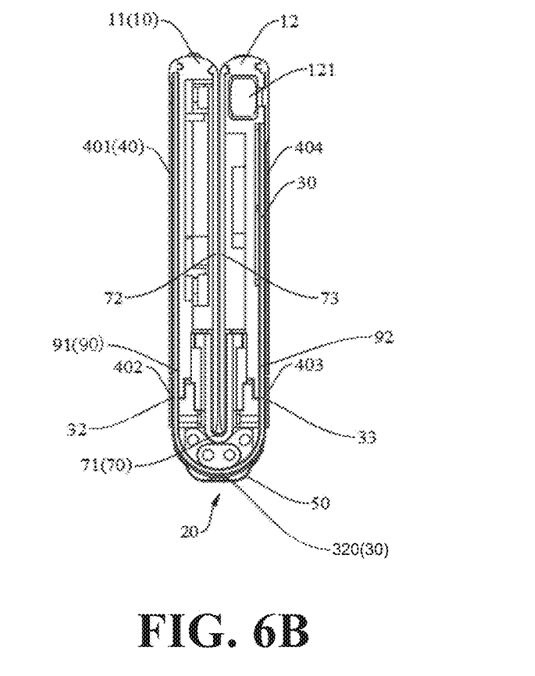
FIG. 6B is a schematic cross-sectional view of the flexible display panel according to an embodiment of the present disclosure in a second folded state.

Specifically, please refer to FIG. 5, FIG. 6A, and FIG. 6B. FIG. 6A is a schematic cross-sectional view of the flexible display panel according to an embodiment of the present disclosure in a first folded state. FIG. 6B is a schematic cross-sectional view of the flexible display panel according to an embodiment of the present disclosure in a second folded state.

In this embodiment, when the flexible display panel body 30 is in a first folded state, the flexible display panel body 30 comprises a first flexible portion 310 that is folded, and a second portion 32 and a third portion 33 located on opposite sides of the first flexible portion 310. The first bendable sub-portion 811 and the third bendable sub-portion 821 are disposed opposite to each other and respectively support opposite sides of the first flexible portion 310. The second bendable sub-portion 812 and the fourth bendable sub-portion 822 are disposed opposite to each other and respectively support the second portion 32 and the third portion 33. It should be noted that the first folded state may be, but is not limited to, a state in which the flexible display panel body 30 is fully folded inwardly. The front side of the first support portion 22 and the front side of the second support portion 23 form an angle of about 0°.

In this embodiment, when the flexible display panel body 30 is in a second folded state, the flexible display panel body 30 comprises a second flexible portion 320 that is folded. The first bendable sub-portion 811 and the second bendable sub-portion 812 support a side of the second flexible portion 320. The third bendable sub-portion 821 and the fourth bendable sub-portion 822 support an opposite side of the second flexible portion 320.

It should be noted that a bending direction of the second flexible portion 320 is opposite to a bending direction of the first flexible portion 310, and the first flexible portion 310 is located within a boundary of the second flexible portion 320. Specifically, the second folded state may be, but is not limited to, a state in which the flexible display panel body 30 is fully folded outwardly. The front side of the first support portion 22 and the front side of the second support portion 23 form an angle of about 360°.

It should be noted that in this embodiment, the technical solution of the present disclosure is described by taking the first folded state as a fully inwardly folded state and the second folded state as a fully outwardly folded state as an example.

Figure 7:
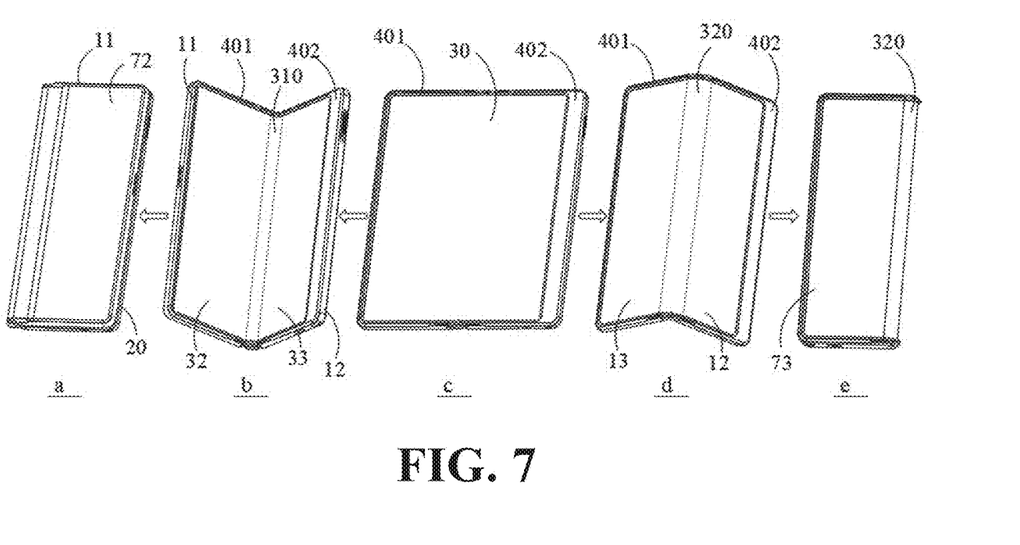
FIG. 7 is a schematic diagram of the flexible display panel according to an embodiment of the present disclosure in various states.

Please refer to FIG. 7. FIG. 7 is a schematic diagram of the flexible display panel according to an embodiment of the present disclosure in various states.

A diagram a in FIG. 7 is a schematic structural diagram of the flexible display panel body in the first folded state. A diagram b in FIG. 7 is a schematic diagram of the flexible display panel body in a first transitional folded state A diagram c in FIG. 7 is a schematic structural diagram of the flexible display panel body in the unfolded state. A diagram d in FIG. 7 is a schematic diagram of the flexible display panel body in a second transitional folded state. A diagram e in FIG. 7 is a schematic structural diagram of the flexible display panel body in the second folded state. It should be noted that when the flexible display panel body 30 is in the first folded state and the first transitional folded state, the first flexible portion 310 is bent. When the flexible display panel body 30 is in the second folded state and the second transitional folded state, the second flexible portion 320 is bent.

It is understandable that in this embodiment, when the flexible display panel body 30 is in the first folded state, the first bendable sub-portion 811 and the third bendable sub-portion 821 are disposed opposite to each other and respectively support the opposite sides of the first flexible portion 310, and the second bendable sub-portion 812 and the fourth bendable sub-portion 822 are disposed opposite to each other and respectively support the second portion 32 and the third portion 33. When the flexible display panel body 30 is in the second folded state, the first bendable sub-portion 811 and the second bendable sub-portion 812 support one side of the second flexible portion 320, and the third bendable sub-portion 821 and the fourth bendable sub-portion 822 support the opposite side of the second flexible portion 320. Therefore, no matter the flexible display panel body 30 is folded at any angle, the support layer 80 can support the flexible display panel body 30, which increases stability and pressure resistance of the flexible display panel, thereby improving user experience.

Furthermore, in this embodiment, a density of the openings 83 in the first bendable sub-portion 811 is greater than a density of the openings 83 in the second bendable sub-portion 812, and a density of the openings 83 in the third bendable sub-portion 821 is greater than a density of the openings 83 in the fourth bendable sub-portion 822. It should be noted that the density of the openings 83 mentioned in this embodiment refers to a ratio of a total area of the openings 83 in a unit area of the support layer 80 to an area of the unit area. For example, the density of the openings 83 in the first bendable sub-portion 811 is a ratio of an area of the openings 83 in the first bendable sub-portion 811 to an area of the first bendable sub-portion 811.

It can be understood that, as shown in FIG. 6A and FIG. 6B, when the flexible display panel body 30 is in the first folded state and the second folded state, it has different bending radii. Specifically, a bending radius of the flexible display panel body 30 in the first folded state is less than a bending radius of the flexible display panel body 30 in the second folded state. When the flexible display panel is in the first folded state, the first flexible portion 310 is bent. At this time, the first bendable sub-portion 811 and the third bendable sub-portion 821 are disposed opposite to each other and respectively support the opposite sides of the first flexible portion 310, and the second bendable sub-portion 812 and the fourth bendable sub-portion 822 are disposed opposite to each other and respectively support the second portion 32 and the third portion 33. Because the densities of the openings 83 in the first bendable sub-portion 811 and the third bendable sub-portion 821 are relatively high, bendability of the flexible display panel body 30 can be effectively improved.

Furthermore, when the flexible display panel body 30 is in the second folded state, the second flexible portion 320 is bent. At this time, the first bendable sub-portion 811 and the second bendable sub-portion 812 support one side of the second flexible portion 320, and the third bendable sub-portion 821 and the fourth bendable sub-portion 822 support the opposite side of the second flexible portion 320. It should be noted that when the flexible display panel body 30 is in the second folded state, it has a greater bending radius. Therefore, a degree of deformation of the second flexible portion 320 when bent is less than a degree of deformation of the first flexible portion 310 when bent. Accordingly, although the density of the openings 83 in the second bendable sub-portion 812 and the density of the openings 83 in the fourth bendable sub-portion 822 are both relatively low, bending can still be performed. Moreover, because the density of the openings 83 in the second bendable sub-portion 812 and the density of the openings 83 in the fourth bendable sub-portion 822 are both relatively low, the second bendable sub-portion 812 and the fourth bendable sub-portion 822 have good stiffness. When the flexible display panel body 30 is switched from a state shown in the diagram e in FIG. 7 to a state shown in the diagram c in FIG. 7, the second flexible portion 320 is pulled back to a position where it is attached to a contact surface of the hinge 20, thereby effectively prevent the following situations. When a current flexible display panel body is switched from a state shown in the diagram c in FIG. 7 to a state shown in the diagram a in FIG. 7, an obviously arched part of the current flexible display panel body formed after the current flexible display panel body is folded outwardly will be crushed and damaged when the current flexible display panel body is folded inwardly.

In this embodiment, the density of the openings 83 in the first bendable sub-portion 811 and the density of the openings 83 in the second bendable sub-portion 812 gradually decrease in a first direction Y1. The density of the openings 83 in the third bendable sub-portion 821 and the density of the openings 83 in the fourth bendable sub-portion 822 both gradually decrease in a second direction Y2. Specifically, in a direction from the first bendable sub-portion 811 to the second bendable sub-portion 12, the density of the openings 83 in the first bendable sub-portion 811 and the density of the openings 83 in the second bendable sub-portion 812 gradually decrease. In a direction from the third bendable sub-portion 821 to the fourth bendable sub-portion 822, the density of the openings 83 in the third bendable sub-portion 821 and the density of the openings 83 in the fourth bendable sub-portion 822 both gradually decrease. As shown in FIG. 4, the first direction is a Y1 direction, the second direction is a Y2 direction, and the first direction Y1 is opposite to the second direction Y2.

It can be understood that in this embodiment, the density of the openings 83 in the first bendable sub-portion 811 and the density of the openings 83 in the second bendable sub-portion 812 gradually decrease in a first direction Y1, and the density of the openings 83 in the third bendable sub-portion 821 and the density of the openings 83 in the fourth bendable sub-portion 822 both gradually decrease in a second direction Y2, so as to effectively adjust bending radii of different bending areas of the flexible display panel, optimize the bending radius of the flexible display panel body 30, and increase its design space.

Figure 8:
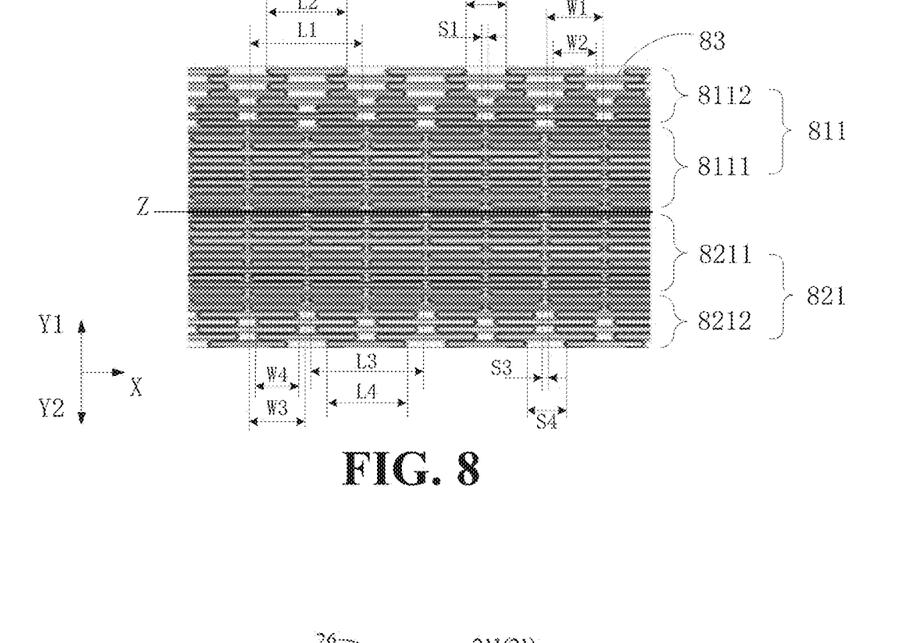
FIG. 8 is a schematic cross-sectional view of a first bendable sub-portion and a third bendable sub-portion according to an embodiment of the present disclosure.

Preferably, in this embodiment, the openings 83 form a plurality of opening groups (not shown) in a third direction X. The openings 83 of the opening groups are arranged in rows in the first direction Y1 and the second direction Y2. The openings 83 in adjacent opening groups are staggered. The third direction X is perpendicular to the first direction Y1 and the second direction Y2. Specifically, the third direction X is an extension direction of the bending centerline. As shown in FIG. 8, the third direction X is a Z direction. It can be understood that in this embodiment, the openings 83 form the opening groups in the third direction X, and the openings 83 in the adjacent opening groups are staggered, which is beneficial to disperse bending stress in the flexible display panel body 30 when the flexible display panel body 30 is bent.

Preferably, a distance between two adjacent rows of openings 83 gradually increases in the first direction Y1, and a distance between two adjacent rows of openings 83 gradually increases in the second direction Y2, which is beneficial to reduce bending stress in the support layer 80 when the support layer 80 is bent.

Specifically, please refer to FIG. 5 and FIG. 8. FIG. 8 is a schematic cross-sectional view of a first bendable sub-portion and a third bendable sub-portion according to an embodiment of the present disclosure.

In this embodiment, in the third direction X, lengths of the openings 83 in the first bendable sub-portion 811 are greater than lengths of the openings 83 in the second bendable sub-portion 812, and lengths of the openings 83 in the third bendable sub-portion 821 are greater than lengths of the openings 83 in the fourth bendable sub-portion 822. In the third direction X, a distance between two adjacent openings 83 in the first bendable sub-portion 811 is less than a distance between two adjacent openings 83 in the second bendable sub-portion 812, and a distance between two adjacent openings 83 in the third bendable sub-portion 821 is less than a distance between two adjacent openings 83 in the fourth bendable sub-portion 822.

The first bendable sub-portion 811 comprises a first bendable sub-part 8111 and a first bendable transition part 8112 located between the first bendable sub-part 8111 and the second bendable sub-portion 812. In the first direction Y1, lengths of the openings 83 in the first bendable sub-part 8111 are same, and lengths of the openings 83 in the first bendable transition part 8112 gradually decrease. The third bendable sub-portion 821 comprises a second bendable sub-part 8211 and a second bendable transition part 8212 located between the second bendable sub-part 8211 and the fourth bendable sub-portion 822. In the second direction Y2, lengths of the openings 83 in the second bendable sub-part 8211 are same, and lengths of the openings 83 in the second bendable transition part 8212 gradually decrease.

Specifically, in the third direction X, in the first bendable sub-part 8111, a length of one opening 83 is a first length L1, and a distance between two adjacent openings 83 is a first distance S1. And, in the first bendable transition part 8112, a length of one opening 83 is a second length L2, and a distance between two adjacent openings 83 is a second distance S2. And, in the second bendable sub-part 8211, a length of one opening 83 is a third length L3, and a distance between two adjacent openings 83 is a third distance S3. And, in the second bendable transition part 8212, a length of one opening 83 is a fourth length L4, and a distance between two adjacent openings 83 is a fourth distance S4.

The first length L1 is equal to the third length L3. The first distance S1 is equal to the third distance S3. The second length L2 is equal to the fourth length L4. The second distance S2 is equal to the fourth distance S4.

In this embodiment, the first length L1 is greater than the second length L2, the first distance S1 is less than the second distance S2, thereby increasing stiffness of the first bendable transition part 8112 of the support layer 80, and improving stress concentration in the first bendable transition part 8112. Furthermore, the third length L3 is greater than the fourth length L4, third distance S3 is less than the fourth distance S4, thereby increasing stiffness of the second bendable transition part 8212 of the support layer 80, and improving stress concentration in the second bendable transition part 8212.

Furthermore, in this embodiment, in the third direction X, the first distance S1 between two adjacent openings 83 in the first bendable sub-part 8111 is same, the second distance S2 between two adjacent openings 83 in the first bendable transition part 8112 gradually increases, the third distance S3 between two adjacent openings 83 in the second bendable sub-part 8211 is same, and the fourth distance S4 between two adjacent openings 83 in the second bendable transition part 8212 gradually increases. It is understandable that, in this embodiment, the second distance S2 between two adjacent openings 83 in the first bendable transition part 8112 gradually increases, and the fourth distance S4 between two adjacent openings 83 in the second bendable transition part 8212 gradually increases, which is beneficial to reduce the bending stress in the support layer 80 when the support layer 80 is bent. Furthermore, the above design can also optimize a bending radius of the first bending area 801 of the support layer 80.

It is understandable that, in this embodiment, the densities of the openings 83 in the first bendable sub-part 8111, the first bendable transition part 8112, the second bendable sub-part 8211, and the second bendable transition part 8212 can be changed by changing the first length L1, the second length L2, the third length L3, the fourth length L4, the first distance S1, the second distance S2, the third distance S3, and the fourth distance S4. Therefore, in this embodiment, the above lengths and distances are not specifically limited.

Preferably, in the first direction Y1, a width of overlapping areas of the openings 83 of two adjacent rows gradually decreases. In the second direction Y2, a width of overlapping areas of the openings 83 of two adjacent rows gradually decreases.

Specifically, in this embodiment, in the first direction Y1, in the first bendable sub-part 8111, a width of overlapping areas of the openings 83 of two adjacent opening groups is a first overlap width W1, and the first overlap width W1 remains unchanged in the first direction Y1. In the first bendable transition part 8112, a width of overlapping areas of the openings 83 of two adjacent opening groups is a second overlap width W2, and the second overlap width W2 gradually decreases in the first direction Y1. In the second direction Y2, in the second bendable sub-part 8211, a width of overlapping areas of the openings 83 of two adjacent opening groups is a third overlap width W3, and the third overlap width W3 remains unchanged in the second direction Y2. In the second bendable transition part 8212, a width of overlapping areas of the openings 83 of two adjacent opening groups is a fourth overlap width W4, and the fourth overlap width W4 gradually decreases in the second direction Y2.

It is understandable that, in this embodiment, the width of the overlapping areas of the openings 83 of the two adjacent rows gradually decreases in the first direction Y1, and the width of the overlapping areas of the openings 83 of the two adjacent rows gradually decreases in the second direction Y2, which is more beneficial to disperse the bending stress in the flexible display panel body 30 when the flexible display panel body 30 is bent.

It should be noted that in this embodiment, the first overlap width W1, the second overlap width W2, the third overlap width W3, the fourth overlap width W4, the fifth overlap width W5, and the sixth overlap width W6 are not specifically limited.

Figure 9:
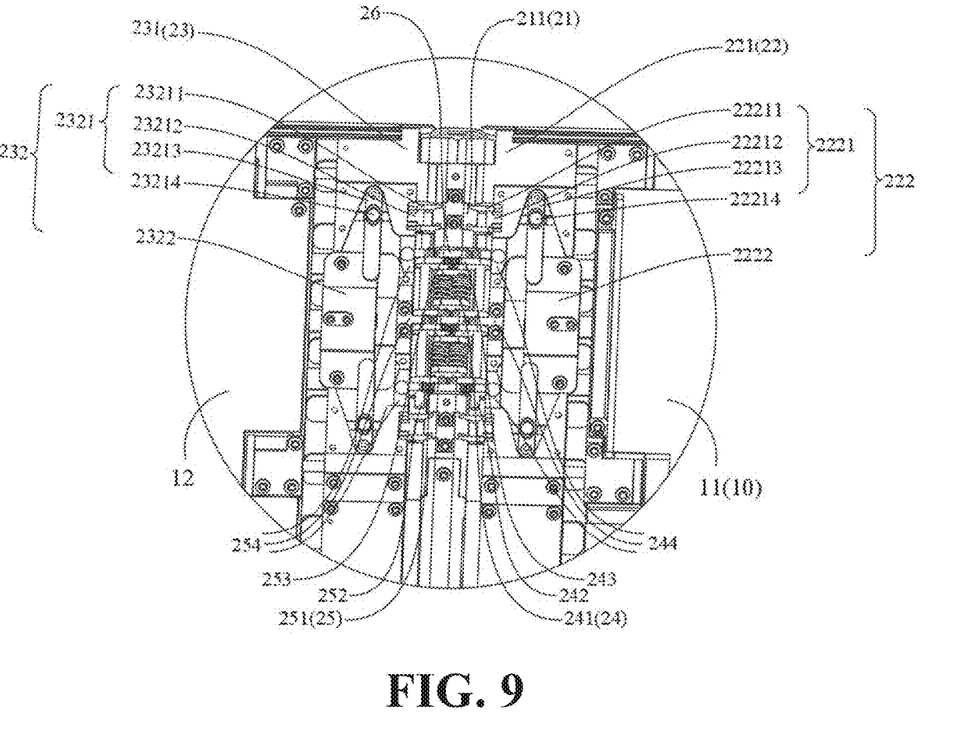
FIG. 9 is a schematic structural diagram of a backside of a hinge according to an embodiment of the present disclosure.

Please refer to FIG. 1, FIG. 6A, FIG. 6B, and FIG. 9. FIG. 9 is a schematic structural diagram of a backside of a hinge according to an embodiment of the present disclosure.

In this embodiment, when the flexible display panel body 30 is in the first folded state, the first housing 11 and the second housing 12 are both located away from the bending portion 21. When the flexible display panel body 30 is in the second folded state, the first housing 11 and the second housing 12 are both located close to the bending portion 21. A radius of curvature of the first flexible portion 310 is less than a radius of curvature of the second flexible portion 320.

Specifically, the first support portion 22 comprises a first support plate 221 and a first movement mechanism 222. The first support plate 221 is rotatably connected to the side of the bending portion 21. An end of the first movement mechanism 222 is slidably connected to the first support plate 221, and another end of the first movement mechanism 222 is fixedly connected to the first housing 11, thereby driving the first housing 11 away from or close to the bending portion 21. The second support portion 23 comprises a second support plate 231 and a second movement mechanism 232. The second support plate 231 is rotatably connected to the opposite side of the bending portion 21. An end of the second movement mechanism 232 is slidably connected to the second support plate 231, and another end of the second movement mechanism 232 is fixedly connected to the second housing 12, thereby driving the second housing 12 away from or close to the bending portion 21.

Specifically, the first movement mechanism 222 is rotatably connected to the side of the bending portion 21 along a first axis. The second movement mechanism 232 is disposed opposite to the first movement mechanism 222 and rotatably connected to the opposite side of the bending portion 21 along a second axis. When the flexible display panel body 30 is in a folded state, both the first housing 11 and the second housing 12 are away from or close to the bent portion 21.

In this embodiment, the first movement mechanism 222 is rotatably connected to the side of the bending portion 21 along the first axis. The second movement mechanism 232 is rotatably connected to the opposite side of the bending portion 21 along the second axis. The first movement mechanism 222 is disposed opposite to the second movement mechanism 232. When the flexible display panel body 30 is in the folded state, both the first housing 11 and the second housing 12 are away from or close to the bent portion 21. This is beneficial for the first support portion 22 and the second support portion 23 to form a wedge shape when the hinge 20 is folded inwardly, thereby leaving a larger accommodating space for the flexible display panel body 30 in the folded state. Furthermore, when the hinge 20 is folded outward, the first housing 11 and the second housing 12 are both close to the bending portion 21, so that a size of the housing 10 and a size of the flexible display panel body 30 are kept matched, thereby preventing the flexible display panel body 30 from being exposed and damaged.

Moreover, in this embodiment, the bending portion 21 comprises a fixing bracket 211. One end of the first movement mechanism 222 is rotatably connected to the fixing bracket 211, and another one end of the first movement mechanism 222 is connected to the first support plate 221. One end of the second movement mechanism 232 is rotatably connected to the fixing bracket 211, and another one end of the second movement mechanism 232 is connected to the second support plate 231.

The first movement mechanism 222 comprises a first transmission mechanism 2221 and a first sliding plate 2222. The second movement mechanism 232 comprises a second transmission mechanism 2321 and a second sliding plate 2322. The first transmission mechanism 2221 is rotatably connected to the bending portion 21 along the first axis. The first transmission mechanism 2221 is slidably connected to the first sliding plate 2222 to drive the first sliding plate 2222 away from or close to the bending portion 21. The first sliding plate 2222 is fixedly connected to the first housing 11. The second transmission mechanism 2321 is rotatably connected to the bending portion 21 along the second axis. The second transmission mechanism 2321 is slidably connected to the second sliding plate 2322 to drive the second sliding plate 2322 away from or close to the bending portion 21. The second sliding plate 2322 is fixedly connected to the second housing 12.

Specifically, the first transmission mechanism 2221 comprises a first transmission member 22211, a first sliding block 22212, and a first swing rod 22213. The second transmission mechanism 2321 comprises a second transmission member 23211, a second sliding block 23212, and a second swing rod 23213.

One end of the first transmission member 22211 is rotatably connected to the fixing bracket 211, and another end of the first transmission member 22211 is rotatably connected to one end of the first sliding block 22212. Another end of the first sliding block 22212 is movably connected to the first swing rod 22213. One end of the first swing rod 22213 is rotatably connected to the first support plate 221, and the other end of the first swing rod 22213 is movably connected to the first sliding plate 2222. The first sliding plate 2222 is fixedly connected to the first housing 11.

One end of the second transmission member 23211 is rotatably connected to the fixing bracket 211, and another end of the second transmission member 23211 is rotatably connected to one end of the second sliding block 23212. Another end of the second sliding block 23212 is movably connected to the second swing rod 23213. One end of the second swing rod 23213 is rotatably connected to the second support plate 231, and the other end of the second swing rod 23213 is movably connected to the second sliding plate 2322. The second sliding plate 2322 is fixedly connected to the second housing 12.

The first support plate 221 is rotatably connected to the bending portion 21 along a third axis. The first sliding plate 2222 is slidably disposed on the first support plate 221. The second support plate 231 is rotatably connected to the bending portion 21 along a fourth axis. The second sliding plate 2322 is slidably disposed on the second support plate 231. Specifically, the first support plate 221 is provided with a first sliding groove (not shown). The second support plate 231 is provided with a second sliding groove (not shown). The first sliding block 22212 is slidably disposed in the first sliding groove. The second sliding block 23212 is slidably disposed in the second sliding groove.

In this embodiment, the hinge 20 further comprises a first rotating mechanism 24 rotatably connected to the bending portion 21 along a fifth axis, and a second rotating mechanism 25 rotatably connected to the bending portion 21 along a sixth axis. The first rotating mechanism 24 comprises a first rotating member 241, a second rotating member 242, a third transmission member 243, and a first linkage fixing member 244. The second rotating mechanism 25 comprises a third rotating member 251, a fourth rotating member 252, a fourth transmission member 253, and a second linkage fixing member 254. It can be understood that the first axis, the third axis, and the fifth axis are parallel to each other, and the second axis, the fourth axis, and the sixth axis are parallel to each other.

The first rotating member 241 is rotatably connected to the bending portion 21 along the fifth axis. The third transmission member 243 is sleeved on the first rotating member 241. The second rotating member 242 is rotatably connected to the third transmission member 243 along the third axis. The first linkage fixing member 244 is sleeved on the second rotating member 242 and fixed to the first support plate 221. The third rotating member 251 is rotatably connected to the bending portion 21 along the sixth axis. The fourth transmission member 253 is sleeved on the third rotating member 251. The fourth rotating member 252 is rotatably connected to the fourth transmission member 253 along the sixth axis. The second linkage fixing member 254 is sleeved on the fourth rotating member 252 and fixed to the second support plate 231. Specifically, the third transmission member 243 is provided with a first gear portion (not shown). The fourth transmission member 253 is provided with a second gear portion (not shown). The first linkage fixing member 244 is provided with a third gear portion (not shown). The second linkage fixing member 254 is provided with a fourth gear portion (not shown). The first gear portion meshes with the second gear portion. The third gear portion meshes with the fourth gear portion.

The hinge 20 further comprises a fixing block 26. The first rotating member 241 and the third rotating member 251 are rotatably connected to the fixing block 26. Each of opposite sides of the fixing block 26 is provided with a rack. The first linkage fixing member 244 is provided with a fifth gear portion (not shown). The second linkage fixing member 254 is provided with a sixth gear portion (not shown). The fifth gear portion and the sixth gear portion respectively mesh with the racks.

It is understandable that in this embodiment, the hinge 20 may further comprise a third rotating mechanism and a fourth rotating mechanism that are disposed opposite to each other, and a fifth rotating mechanism and a sixth rotating mechanism that are disposed opposite to each other. Their structures and meshing relationships are same as those of the first rotating mechanism 24 and the second rotating mechanism 25, which are not described in this embodiment.

It should be noted that the first axis, the second axis, the third axis, the fourth axis, the fifth axis, and the sixth axis may all be virtual or physical axes, which are not specifically limited in this embodiment.

Furthermore, the hinge 20 mentioned in this embodiment is only used to illustrate the technical solution of the present disclosure. In this embodiment, a type of the hinge 20 is not specifically limited.

In this embodiment, the first transmission mechanism 2221 further comprises a first fixing member 22214. The second transmission mechanism 2321 further comprises a second fixing member 23214. The first swing rod 22213 is provided with a third sliding groove (not shown). The second swing rod 23213 is provided with a fourth sliding groove (not shown). The first fixing member 22214 passes through the third sliding groove and is fixedly connected to the first sliding block 22212. The second fixing member 23214 passes through the fifth sliding groove and is fixedly connected to the second sliding block 23212. It should be noted that the first fixing member 22214 and the second fixing member 23214 may be, but are not limited to, axle pins.

The first transmission mechanism 2221 further comprises a third fixing member (not shown). The second transmission mechanism 2321 further comprises a fourth fixing member (not shown). The first sliding plate 2222 is provided with a fifth sliding groove (not shown). The second sliding plate 2322 is provided with a sixth sliding groove (not shown). The third fixing member passes through the fifth sliding groove and is fixedly connected to the first swing rod 22213. The fourth fixing member passes through the sixth sliding groove and is fixedly connected to the second swing rod 23213. It should be noted that the third fixing member and the fourth fixing member may be, but are not limited to, convex structures.

Specifically, the first rotating member 241 and the third rotating member 251 are rotatably connected to the fixing block 26. The opposite sides of the fixing block 26 are respectively provided with two racks. The fifth gear portion and the sixth gear portion respectively mesh with the two racks. The first gear portion meshes with the second gear portion. The third gear portion meshes with the fourth gear portion. Therefore, when the flexible display panel body 30 is in a folded state, the hinge 20 rotates symmetrically. The first transmission member 22211 pushes the first sliding block 22212 to slide in the first sliding groove. The second transmission member 23211 pushes the second sliding block 23212 to slide in the second sliding groove. The first sliding block 22212 pushes the first swing rod 22213 to rotate by a first angle through the first fixing member 22214. The second sliding block 23212 pushes the second swing rod 23213 to rotate by a second angle through the second fixing member 23214. The first angle is same as the second angle.

Furthermore, the first swing rod 22213 pushes the first sliding plate 2222 to slide in the first support plate 221 through the third fixing member, so as to drive the first housing 11 away from or close to the bending portion 21. The second swing rod 23213 pushes the second sliding plate 2322 to slide in the second support plate 231 through the fourth fixing member, so as to drive the second housing 12 away from or close to the bending portion 21. Therefore, when the flexible display panel body 30 is in the folded state, the size of the housing 10 and the size of the flexible display panel body 30 are kept matched, so that the flexible display panel body 30 will not be greatly pulled or squeezed during bending.

The flexible display panel further comprises an auxiliary support layer 90 disposed on a side of the support layer 80 away from the flexible display panel body 30. The auxiliary support layer 90 is disposed between the support layer 80 and the hinge 20. The auxiliary support layer 90 at least covers a junction between the first support portion 22 and the first housing 11, a junction between the first support portion 22 and the bending portion 21, a junction between the second support portion 23 and the bending portion 21, and a junction between the second support portion 23 and the second housing 12.

Specifically, in this embodiment, the auxiliary support layer 90 may be made of, but is not limited to, stainless steel, spring steel sheet, and titanium alloy, and may be a full-surface metal plate or a metal mesh structure. It can be understood that a thickness and a type of the auxiliary support layer 90 are not specifically limited in this embodiment.

Specifically, in this embodiment, there is a first gap between the first support portion 22 and the first housing 11. There is a second gap between the first support portion 22 and the bending portion 21. There is a third gap between the second support portion 23 and the bending portion 21. There is a fourth gap between the second support portion 23 and the second housing 12.

The auxiliary support layer 90 comprises a first auxiliary support layer 91 and a second auxiliary support layer 92 disposed at intervals. There is a first space between the first auxiliary support layer 91 and the second auxiliary support layer 92. The first space is located corresponding to the bending portion 21. Specifically, an orthographic projection of inner walls of the first space on the bending portion 21 is located within a boundary of the bending portion 21.

The first auxiliary support layer 91 covers at least the first gap and the second gap, and the second auxiliary support layer 92 covers at least the third gap and the fourth gap, thereby covering step differences between the first housing 11, the first support portion 22, the bending portion 21, the second support portion 23, and the second housing 12 under the flexible display panel body 30 when the flexible display panel main body 30 is in the unfolded state and improving the user experience.

Furthermore, when the flexible display panel body 30 is in the first folded state, the first auxiliary support layer 91 and the second auxiliary support layer 92 are disposed opposite to each other and respectively support the opposite sides of the first flexible portion 310. At the same time, the first auxiliary support layer 91 and the second auxiliary support layer 92 support the second portion 32 and the third portion 33. When the flexible display panel body 30 is in the second folded state, the first auxiliary support layer 91 and the second auxiliary support layer 92 are disposed opposite to each other and respectively support opposite sides of the second flexible portion 320. Therefore, when the flexible display panel body 30 is bent, the first auxiliary support layer 91 and the second auxiliary support layer 92 protect the first flexible portion 310 or the second flexible portion 320. Moreover, because the first auxiliary support layer 91 and the second auxiliary support layer 92 are spaced apart, when the flexible display panel body 30 is bent, the first auxiliary support layer 91 and the second auxiliary support layer 92 have little effect on stress in internal layers of the flexible display panel body 30.

Furthermore, the flexible display panel further comprises a rear cover 27 disposed corresponding to the bending portion 21. The rear cover 27 is connected to the bending portion 21. The rear cover 27 is located on a side of the hinge 20 away from the flexible display panel body 30. A body part 51 of a dust plug 50 is connected with the rear cover 27.

In this embodiment, the front frame structure 40 comprises a first front frame portion 401 connected to the first housing 11, a second front frame portion 402 connected to the first support portion 22, a third front frame portion 403 connected to the second support portion 23, and a fourth front frame portion 404 connected to the second housing 12. When the folding display device is folded at any angle, sides of the flexible display panel body 30 and a gap between the housing 10 and the hinge 20 are encapsulated, thereby preventing the flexible display panel body 30 from being exposed and damaged.

Moreover, in this embodiment, the flexible display panel further comprises a soft strip 60 disposed on a side of the light-emitting surface of the flexible display panel body 30. The soft strip 60 is disposed between the front frame structure 40 and the flexible display panel body 30, and opposite ends of the soft strip 60 are respectively connected to the first front frame portion 401 and the fourth front frame portion 404. It is understandable that the soft strip 60 is made of a flexible material. During bending of the flexible display panel, the soft strip 60 is bent along with the flexible display panel body 30, thereby further preventing external impurities from entering the flexible display panel.

Furthermore, in this embodiment, the flexible display panel further comprises the dust plug 50 disposed on a side surface of the flexible display panel body 30 and corresponding to the bending portion 21. The dust plug 50 comprises a third sliding rail (not shown). The soft strip 60 is at least partially disposed in the third sliding rail and is slidably connected with the dust plug 50.

Specifically, the dust plug 50 comprises the body part 51 and a hook part 52. The body part 51 is disposed corresponding to the side surface of the flexible display panel body 30. The hook part 52 is disposed on the side of the soft strip 60 away from the flexible display panel body 30. The third sliding rail is provided at a junction of the body part 51 and the hook part 52. Furthermore, the body part 51 of the dust plug 50 is connected with the rear cover 27.

In this embodiment, as shown in FIG. 1 and FIG. 2, the flexible display panel further comprises a shielding mechanism 70. The shielding mechanism 70 is disposed on the side of the hinge 20 away from the flexible display panel body 30 and covers the flexible display panel body 30. It can be understood that the shielding mechanism 70 is configured to shield and protect the hinge 20 when the flexible display panel is in the folded state.

The shielding mechanism 70 comprises an elastic shielding member 71 covering the hinge 20, a first shielding member 72 disposed on a side of the elastic shielding member 71 and fixedly connected to the first housing 11, and a second shielding member 73 disposed on an opposite side of the elastic shielding member 71 and fixedly connected to the second housing 12. The elastic shielding member 71 is connected to the hinge 20. A surface of the first shielding member 72 facing the flexible display panel body 30 and a surface of the second shielding member 73 facing the flexible display panel body 30 are coplanar to form a support surface for the flexible display panel body 30.

Two opposite side parts and a middle part of the elastic shielding member 71 are made of a hard material, and the other parts of the elastic shielding member 71 are made of an elastic soft material. The two opposite side parts of the elastic shielding member 71 made of the hard material may be respectively fixedly connected to backsides of the first support portion 22 and the second support portion 23 by screws, and can be folded or unfolded along with the first support portion 22 and the second support portion 23.

The middle part of the elastic shielding member 71 made of the hard material may be fixedly connected to a backside of the bending portion 21 by adhesive or the like. The first shielding member 72, the second shielding member 73, and the elastic shielding member 71 together form a component that shields a backside of the flexible display panel body 30. The first shielding member 72 and the second shielding member 73 can respectively shield opposite sides of the elastic shielding member 71. When the flexible display panel body 30 is folded inwardly or outwardly, the elastic shielding member 71 can slide relative to the first shielding member 72 and the second shielding member 73.

In this embodiment, as shown in FIG. 1, the flexible display panel may further comprise a touch pen 100. The touch pen 100 can be used to click and touch the flexible display panel body 30. The second housing 12 is provided with a pen slot 121. When the touch pen 100 is not in use, the touch pen 100 may be accommodated in the pen slot 121. When the touch pen 100 needs to be used, the touch pen 100 may be taken out of the pen slot 121.

The present disclosure further provides an electronic device. The electronic device comprises the flexible display panel described in any of the above embodiments.

It can be understood that the flexible display panel has been described in detail in the above embodiments, and will not be described in detail herein.

In specific applications, the electronic device may be a display screen of a device such as a smart phone, a tablet computer, a notebook computer, a smart bracelet, a smart watch, a smart glasses, a smart helmet, a desktop computer, a smart television, or a digital camera.

It should be understood that those skilled in the art may make equivalent replacements or changes based on the technical solutions and inventive concepts of the present application, and all such changes or replacements shall fall within the scope of the claims of the present application.

What is claimed is:

1. A flexible display panel, comprising:
a flexible display panel body; and
a support layer disposed on a side of the flexible display panel body and comprising a first bendable portion and a second bendable portion that are adjacent to each other, wherein the first bendable portion comprises a first bendable sub-portion and a second bendable sub-portion that are sequentially away from the second bendable portion, the second bendable portion comprises a third bendable sub-portion and a fourth bendable sub-portion that are sequentially away from the first bendable portion, and the first bendable sub-portion, the second bendable sub-portion, the third bendable sub-portion, and the fourth bendable sub-portion are all provided with openings;
wherein when the flexible display panel body is in a first folded state, the flexible display panel body comprises a first flexible portion that is folded, and a second portion and a third portion located on opposite sides of the first flexible portion, the first bendable sub-portion and the third bendable sub-portion are disposed opposite to each other and respectively support opposite sides of the first flexible portion, and the second bendable sub-portion and the fourth bendable sub-portion are disposed opposite to each other and respectively support the second portion and the third portion;
when the flexible display panel body is in a second folded state, the flexible display panel body comprises a second flexible portion that is folded, the first bendable sub-portion and the second bendable sub-portion support a side of the second flexible portion, and the third bendable sub-portion and the fourth bendable sub-portion support an opposite side of the second flexible portion; and
a bending direction of the second flexible portion is opposite to a bending direction of the first flexible portion, and the first flexible portion is located within a boundary of the second flexible portion;
wherein the flexible display panel further comprises:
a housing comprising a first housing and a second housing; and
a hinge disposed in the housing, connected to the first housing and the second housing, and comprising:
a bending portion;
a first support portion disposed on a side of the bending portion and corresponding to the first housing, wherein a side of the first support portion is rotatably connected to the side of the bending portion, and an opposite side of the first support portion is slidably connected to the first housing; and a second support portion disposed on an opposite side of the bending portion and corresponding to the second housing, wherein a side of the second support portion is rotatably connected to the opposite side of the bending portion, and an opposite side of the second support portion is slidably connected to the second housing;

wherein the flexible display panel body is disposed in the housing and disposed on sides of the first housing, the second housing, and the hinge, and the support layer is disposed between the flexible display panel body and the hinge.

2. The flexible display panel according to claim 1, wherein a density of the openings in the first bendable sub-portion is greater than a density of the openings in the second bendable sub-portion, and a density of the openings in the third bendable sub-portion is greater than a density of the openings in the fourth bendable sub-portion.

3. The flexible display panel according to claim 2, wherein
the density of the openings in the first bendable sub-portion and the density of the openings in the second bendable sub-portion gradually decrease in a first direction, and the first direction is a direction from the first bendable sub-portion to the second bendable sub-portion; and
the density of the openings in the third bendable sub-portion and the density of the openings in the fourth bendable sub-portion both gradually decrease in a second direction, and the second direction is a direction from the third bendable sub-portion to the fourth bendable sub-portion.

4. The flexible display panel according to claim 3, wherein the openings form a plurality of opening groups in a third direction, the opening groups are arranged in rows in the first direction and the second direction, the openings in adjacent opening groups are staggered, and the third direction is perpendicular to the first direction and the second direction.

5. The flexible display panel according to claim 4, wherein in the third direction, lengths of the openings in the first bendable sub-portion are greater than lengths of the openings in the second bendable sub-portion, and lengths of the openings in the third bendable sub-portion are greater than lengths of the openings in the fourth bendable sub-portion.

6. The flexible display panel according to claim 5, wherein in the third direction, a distance between two adjacent openings in the first bendable sub-portion is less than a distance between two adjacent openings in the second bendable sub-portion, and a distance between two adjacent openings in the third bendable sub-portion is less than a distance between two adjacent openings in the fourth bendable sub-portion.

7. The flexible display panel according to claim 6, wherein
the first bendable sub-portion comprises a first bendable sub-part and a first bendable transition part located between the first bendable sub-part and the second bendable sub-portion, and in the first direction, lengths of the openings in the first bendable sub-part are same, and lengths of the openings in the first bendable transition part gradually decrease; and the third bendable sub-portion comprises a second bendable sub-part and a second bendable transition part located between the second bendable sub-part and the fourth bendable sub-portion, and in the second direction, lengths of the openings in the second bendable sub-part are same, and lengths of the openings in the second bendable transition part gradually decrease.

8. The flexible display panel according to claim 7, wherein in the third direction, a distance between two adjacent openings in the first bendable sub-part is same, a distance between two adjacent openings in the first bendable transition part gradually increases, a distance between two adjacent openings in the second bendable sub-part is same, and a distance between two adjacent openings in the second bendable transition part gradually increases.

9. The flexible display panel according to claim 1, wherein
when the flexible display panel body is in the first folded state, the first housing and the second housing are both located away from the bending portion;
when the flexible display panel body is in the second folded state, the first housing and the second housing are both located close to the bending portion; and
a radius of curvature of the first flexible portion is less than a radius of curvature of the second flexible portion.

10. The flexible display panel according to claim 9, wherein
the first support portion comprises a first support plate and a first movement mechanism, the first support plate is rotatably connected to the side of the bending portion, an end of the first movement mechanism is slidably connected to the first support plate, and another end of the first movement mechanism is fixedly connected to the first housing; and
the second support portion comprises a second support plate and a second movement mechanism, the second support plate is rotatably connected to the opposite side of the bending portion, an end of the second movement mechanism is slidably connected to the second support plate, and another end of the second movement mechanism is fixedly connected to the second housing.

11. The flexible display panel according to claim 10, wherein
the bending portion comprises a fixing bracket;
the first movement mechanism comprises a first transmission mechanism and a first sliding plate, the first transmission mechanism is rotatably connected to the fixing bracket along a first axis and slidably connected to the first sliding plate, and the first sliding plate is fixedly connected to the first housing; and
the second movement mechanism comprises a second transmission mechanism and a second sliding plate, the second transmission mechanism is rotatably connected to the fixing bracket along a second axis and slidably connected to the second sliding plate, and the second sliding plate is fixedly connected to the second housing.

12. The flexible display panel according to claim 1, further comprising:
an auxiliary support layer disposed on a side of the support layer away from the flexible display panel body, disposed between the support layer and the hinge, and at least covering a junction between the first support portion and the first housing, a junction between the first support portion and the bending portion, a junction between the second support portion and the bending portion, and a junction between the second support portion and the second housing.

13. An electronic device, comprising a flexible display panel, wherein the flexible display panel comprises:
a flexible display panel body; and
a support layer disposed on a side of the flexible display panel body and comprising a first bendable portion and a second bendable portion that are adjacent to each other, wherein the first bendable portion comprises a first bendable sub-portion and a second bendable sub-portion that are sequentially away from the second bendable portion, the second bendable portion comprises a third bendable sub-portion and a fourth bendable sub-portion that are sequentially away from the first bendable portion, and the first bendable sub-portion, the second bendable sub-portion, the third bendable sub-portion, and the fourth bendable sub-portion are all provided with openings;
wherein when the flexible display panel body is in a first folded state, the flexible display panel body comprises a first flexible portion that is folded, and a second portion and a third portion located on opposite sides of the first flexible portion, the first bendable sub-portion and the third bendable sub-portion are disposed opposite to each other and respectively support opposite sides of the first flexible portion, and the second bendable sub-portion and the fourth bendable sub-portion are disposed opposite to each other and respectively support the second portion and the third portion;
when the flexible display panel body is in a second folded state, the flexible display panel body comprises a second flexible portion that is bent, the first bendable sub-portion and the second bendable sub-portion support a side of the second flexible portion, and the third bendable sub-portion and the fourth bendable sub-portion support an opposite side of the second flexible portion; and
a bending direction of the second flexible portion is opposite to a bending direction of the first flexible portion, and the first flexible portion is located within a boundary of the second flexible portion;
wherein the flexible display panel further comprises:
a housing comprising a first housing and a second housing; and
a hinge disposed in the housing, connected to the first housing and the second housing, and comprising:
a bending portion;
a first support portion disposed on a side of the bending portion and corresponding to the first housing, wherein a side of the first support portion is rotatably connected to the side of the bending portion, and an opposite side of the first support portion is slidably connected to the first housing; and
a second support portion disposed on an opposite side of the bending portion and corresponding to the second housing, wherein a side of the second support portion is rotatably connected to the opposite side of the bending portion, and an opposite side of the second support portion is slidably connected to the second housing;
wherein the flexible display panel body is disposed in the housing and disposed on sides of the first housing, the second housing, and the hinge, and the support layer is disposed between the flexible display panel body and the hinge.

14. The electronic device according to claim 13, wherein a density of the openings in the first bendable sub-portion is greater than a density of the openings in the second bendable sub-portion, and a density of the openings in the third bendable sub-portion is greater than a density of the openings in the fourth bendable sub-portion.

15. The electronic device according to claim 14, wherein
the density of the openings in the first bendable sub-portion and the density of the openings in the second bendable sub-portion gradually decrease in a first direction, and the first direction is a direction from the first bendable sub-portion to the second bendable sub-portion; and
the density of the openings in the third bendable sub-portion and the density of the openings in the fourth bendable sub-portion both gradually decrease in a second direction, and the second direction is a direction from the third bendable sub-portion to the fourth bendable sub-portion.

16. The electronic device according to claim 15, wherein the openings form a plurality of opening groups in a third direction, the opening groups are arranged in rows in the first direction and the second direction, the openings in adjacent opening groups are staggered, and the third direction is perpendicular to the first direction and the second direction.

17. The electronic device according to claim 16, wherein in the third direction, lengths of the openings in the first bendable sub-portion are greater than lengths of the openings in the second bendable sub-portion, and lengths of the openings in the third bendable sub-portion are greater than lengths of the openings in the fourth bendable sub-portion.

18. The electronic device according to claim 17, wherein in the third direction, a distance between two adjacent openings in the first bendable sub-portion is less than a distance between two adjacent openings in the second bendable sub-portion, and a distance between two adjacent openings in the third bendable sub-portion is less than a distance between two adjacent openings in the fourth bendable sub-portion.

19. The electronic device according to claim 18, wherein
the first bendable sub-portion comprises a first bendable sub-part and a first bendable transition part located between the first bendable sub-part and the second bendable sub-portion, and in the first direction, lengths of the openings in the first bendable sub-part are same, and lengths of the openings in the first bendable transition part gradually decrease; and
the third bendable sub-portion comprises a second bendable sub-part and a second bendable transition part located between the second bendable sub-part and the fourth bendable sub-portion, and in the second direction, lengths of the openings in the second bendable sub-part are same, and lengths of the openings in the second bendable transition part gradually decrease.

* * * * *